US012604427B2

(12) United States Patent
Kartadinata et al.

(10) Patent No.: US 12,604,427 B2
(45) Date of Patent: Apr. 14, 2026

(54) HYBRID FACEPLATE FOR COMPUTING SYSTEMS

(71) Applicant: Hewlett Packard Enterprise Development LP, Houston, TX (US)

(72) Inventors: Warren A. Kartadinata, Fremont, CA (US); Robert E. Cayou, Tracy, CA (US); Harold Zin Htutt, Fremont, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 598 days.

(21) Appl. No.: 17/849,452

(22) Filed: Jun. 24, 2022

(65) Prior Publication Data

US 2023/0422424 A1 Dec. 28, 2023

(51) Int. Cl.
| | |
|---|---|
| *H05K 5/04* | (2006.01) |
| *H05K 5/02* | (2006.01) |
| *H05K 5/03* | (2006.01) |
| *H05K 7/14* | (2006.01) |

(52) U.S. Cl.
CPC .............. *H05K 5/04* (2013.01); *H05K 5/023* (2013.01); *H05K 5/03* (2013.01); *H05K 7/1487* (2013.01)

(58) Field of Classification Search
CPC ............ H05K 5/04; H05K 5/023; H05K 5/03; H05K 7/1487
See application file for complete search history.

(56) References Cited

U.S. PATENT DOCUMENTS

| | | | | |
|---|---|---|---|---|
| 6,285,548 B1* | 9/2001 | Hamlet | ................ | H05K 7/1461 |
| | | | | 361/689 |
| 7,576,979 B1* | 8/2009 | Dearborn | ............. | H05K 7/1489 |
| | | | | 600/219 |
| 9,648,771 B1* | 5/2017 | Markowski | .......... | H05K 7/1401 |
| 9,766,667 B1* | 9/2017 | Singer | ..................... | G06F 1/185 |
| 10,303,220 B1* | 5/2019 | Murray | .................... | H05K 7/00 |

(Continued)

FOREIGN PATENT DOCUMENTS

| | | |
|---|---|---|
| CN | 110703878 A | 1/2020 |
| CN | 111552354 A | 8/2020 |
| CN | 212484266 U | 2/2021 |

(Continued)

OTHER PUBLICATIONS

17849452_2024-09-04_CN_215576495_U_M (machine translation) (Year: 2022).*

(Continued)

*Primary Examiner* — Hung S. Bui
*Assistant Examiner* — Elisa Sasserath
(74) *Attorney, Agent, or Firm* — Yao Legal Services, Inc.

(57) ABSTRACT

One aspect described in the present disclosure provides a faceplate for a computing system. The faceplate includes a die-cast metallic frame and a sheet-metal front face attached to the die cast metallic frame. The die-cast metallic frame includes at least one attachment mechanism protruding beyond the sheet-metal front face for attaching a handle used for insertion or ejection of hardware attached to the faceplate. This configuration allows the die-cast metallic frame to bear a force associated with insertion or ejection of the hardware. Furthermore, the sheet-metal front face does not bear the force associated with insertion or ejection of the hardware.

20 Claims, 6 Drawing Sheets

(56)         References Cited

U.S. PATENT DOCUMENTS 11,311,114 B1 *   4/2022  Fleisher ............... A47C 27/065
11,744,026 B1 *   8/2023  Villanueva ............. H05K 5/069
                                                     174/561

FOREIGN PATENT DOCUMENTS

CN          213843978 U       7/2021
CN          215576495 U   *   1/2022

OTHER PUBLICATIONS

Yang (CN 215576495 U) translation (Year: 2022).*
Yang (CN 215576495 U) (Year: 2021).*
Yang et. al (CN_215576495_U) (Year: 2022).*

* cited by examiner

HYBRID FACEPLATE FOR COMPUTING SYSTEMS

BACKGROUND

This disclosure is generally related to the design of an enclosure for computing systems.

With the rapid advancement in computer technology and growth in cloud computing, there is a corresponding increase in the amount and density of computing hardware located in data centers. One or more servers or computing nodes can be housed in a chassis, which is a metal structure used to enclose or assemble computer components in various form factors. A chassis makes it possible to place multiple servers and other storage and peripheral equipment in a single physical body.

Chassis can be classified according to their physical dimensions and are termed as being a 1U, 2U, or up to 20U and more, where U represents the number of units. For example, a 1U chassis can house up to two servers. In general, a server, which can also be referred to as a computing node, storage node (where the server's main purpose is to provide storage service), or simply "node," is housed in a stand-alone enclosure. This enclosure can be referred to as a "node enclosure." In a 1U chassis, two node enclosures can be inserted, with each enclosure housing a computing node.

BRIEF DESCRIPTION OF THE FIGURES

In the figures, like reference numerals refer to the same figure elements.

DETAILED DESCRIPTION

Figure 1A:
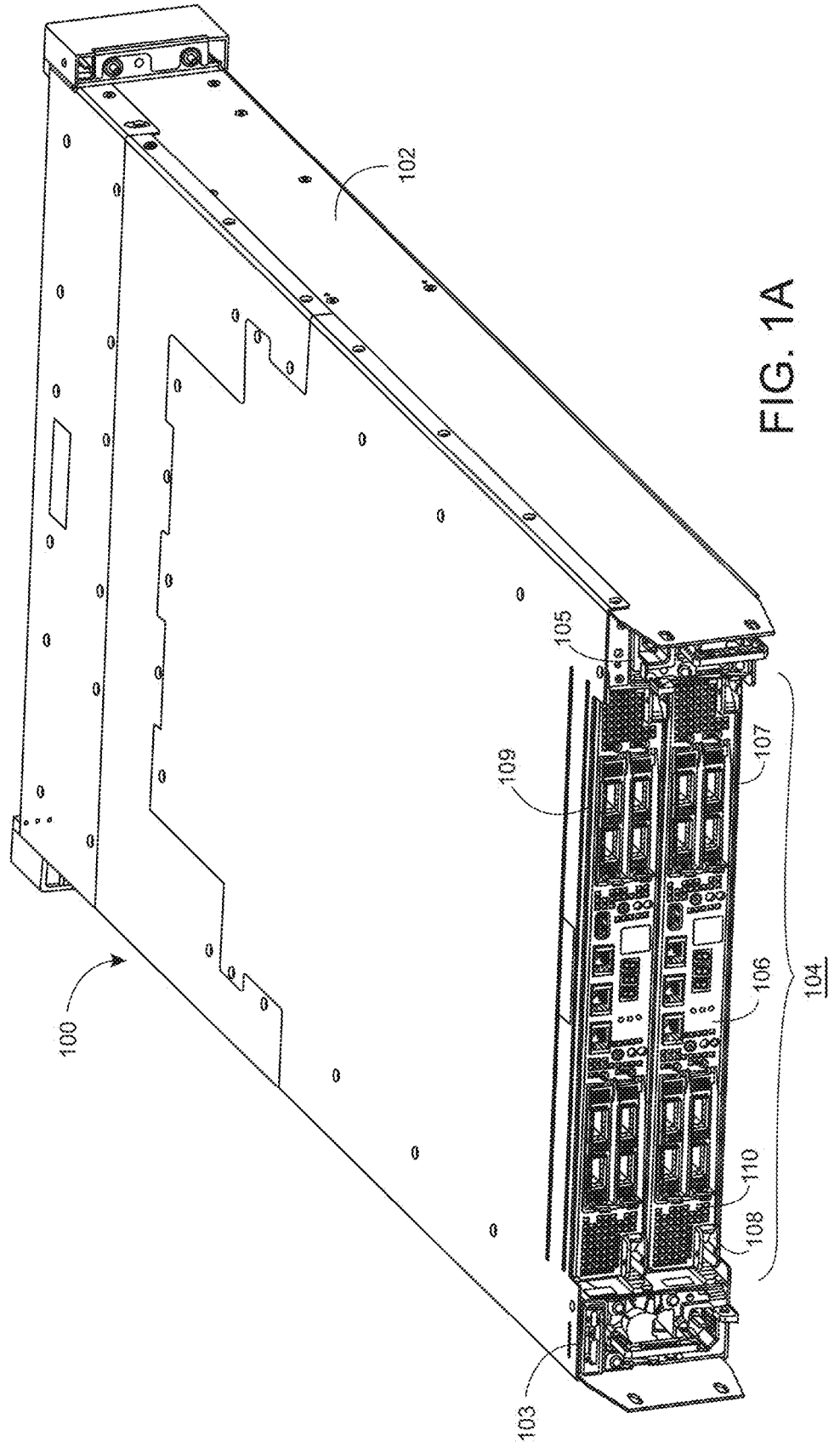
FIG. 1A illustrates the rear side of a storage server chassis, in accordance with one aspect of the present disclosure.

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

A node enclosure can include a faceplate and a base pan. The faceplate can be attached to the base pan and together they form the platform on which various components can be assembled (such as the mother board, CPUs, memory modules, and fans). To save space, it is desirable to have a high component density inside a node enclosure. For example, a fully populated node enclosure can require a force up to 130 pounds or more in total to inject or eject all the connectors and components into or from a center panel. The faceplate, which can be the strongest and most rigid part of a node enclosure, can serve as the main physical interface for inserting and ejecting the assembled hardware into and out of a chassis, which can be secured in a rack. During installation and removal of a node from the chassis, most of the force associated with moving the hardware is applied to the faceplate.

To meet the mechanical requirements for inserting and ejecting the hardware assembly of a node, the faceplate can be made of rigid and robust materials. For servers that require a significant amount of force (e.g., over 100 pounds in total) to insert and eject the hardware, the faceplate can use a single piece of die-cast metal, such as aluminum. Note that although sheet metal is often used for computer enclosures, it is typically not used for load-bearing faceplates of servers, because the limited thickness of sheet metal limits the amount of load it can bear. Instead, thicker and more rigid materials and structures (such as structures produced from metal blocks or die-cast metal, with thickness greater than 5 mm) are used to manufacture faceplates for server enclosures that can withstand significant insertion/ejection force. Various metal-processing techniques can be used to create the form and shape needed for a faceplate. Such techniques include extrusion, milling, and die casting. Die casting is generally more cost-effective compared with other techniques. Die casting is a metal casting process that is characterized by forcing molten metal under high pressure into a mold cavity. The mold cavity is typically created using two hardened tool steel dies which have been machined into shape and work similarly to an injection mold during the process.

The single-piece die-cast faceplate design does not always meet various design goals. Due to the inherent limitations of the die casting process, it is difficult for such a design to meet the cosmetic, dimension, and process consistency (i.e., to produce reliably the same product repeatedly) requirements. For example, there is a certain level of variation in the dimensions of the end product of the die casting process. Cosmetic compromises, such as less-than-ideal surface smoothness and definition of details, are often made to achieve the desired dimension and process consistency in the die casting process.

Aspects of the present disclosure solve the technical problem of achieving cosmetic, dimension, and process consistency in faceplate designs by providing a two-piece faceplate that has a die-cast metal frame and a sheet-metal front face. The die-cast metal frame provides the rigidity for bearing the force of inserting or ejecting hardware and connectors housed in the enclosure. The sheet-metal front face, which does not bear the force, can provide better cosmetics, dimension and process consistency, and facilitates more cost-effective design changes.

This two-piece hybrid faceplate design combines the sturdiness and rigidity of die-cast metal with the processability and cosmetic advantages of sheet metal. The die-cast metallic frame serves as the load-bearing portion, and the sheet-metal front face is not load-bearing. Mechanically, this two-piece hybrid faceplate can withstand the insertion/ejection force in a similar manner as conventional single-piece die-cast faceplates. Cosmetically, this new faceplate can provide all the advantages of sheet metal, including better cosmetic features (e.g., surface smoothness, well defined edges and corners, and precise opening patterns) and inexpensive metal processing techniques (e.g., cutting, stamping, and bending). Furthermore, the configuration of the sheet-metal front face can be changed rapidly and cost-effectively, because low-cost processing techniques (such as laser cutting) can be used to change the layout design on the front face. Note that the sheet-metal processing techniques such as cutting, stamping, and bending are not applicable to die-cast bulk metals. Although laser cutting can be used to engrave die-cast metallic structures, it typically cannot cut through such structures because of their greater thickness.

In general, a server chassis has a front side and a rear side. The front side is the "clean" side facing toward the front of a server rack. For storage servers, drives (such as solid state drives (SSDs) and hard drives) can be inserted into bays on the front side. The rear side is where the input/output (I/O) ports such as Universal Serial Bus (USB) and network ports (e.g., Registered Jack 45 (RJ45), small form-factor pluggable (SFP), Fibre Channel, and Nonvolatile Memory Express over Fiber (NVMeoF) ports) are located. The faceplate of a node enclosure faces the rear side of the chassis, and has a number of openings for various I/O ports. When the node is inserted into the chassis, the node is typically handled by the faceplate and slid into the chassis from the chassis' rear side. Similarly, when the node is removed, it is pulled out of the chassis by the faceplate from the rear side of the chassis.

FIG. 1A illustrates the rear side of a storage server chassis, in accordance with one aspect of the present disclosure. In this example, two storage nodes 107 and 109 are housed in a chassis 100. Chassis 100 has two side rails, such as side rail 102, which can be secured to the columns of a server rack.

Nodes 107 and 109 are stacked vertically in chassis 100. Each node has a respective faceplate, such as faceplate 104. Faceplate 104 can include a die-cast metallic frame (not shown) and a sheet-metal front face 106, which is produced from a single piece of sheet metal with a thickness of 6 mm or less. (More details on the die-cast frame and sheet-metal front face are provided in the description below in conjunction with FIGS. 2A and 2B.) Front face 106 can include a number of openings which can accommodate various I/O ports. Furthermore, front face 106 can include perforations 110 to dissipate heat generated by the computer components.

Note that chassis 100 can house two power supply modules 103 and 105, which supply power to nodes 107 and 109, respectively. Each power supply module has a handle for removal from chassis 100. Furthermore, the die-cast metallic frame of a faceplate can have two hinge housings extending beyond the sheet-metal front face. These hinge housings can be used to attach release handles, which can be used to eject the node enclosure away from chassis 100. For example, faceplate 104 can have hinge housing 108, which can house a hinge pin of a release handle (not shown here). When the release handle rotates around the hinge pin, the rotational movement can cause the node enclosure to slide out of chassis 100. More details on the release handle and hinge housing are provided below in conjunction with FIG. 2A.

Figure 1B:
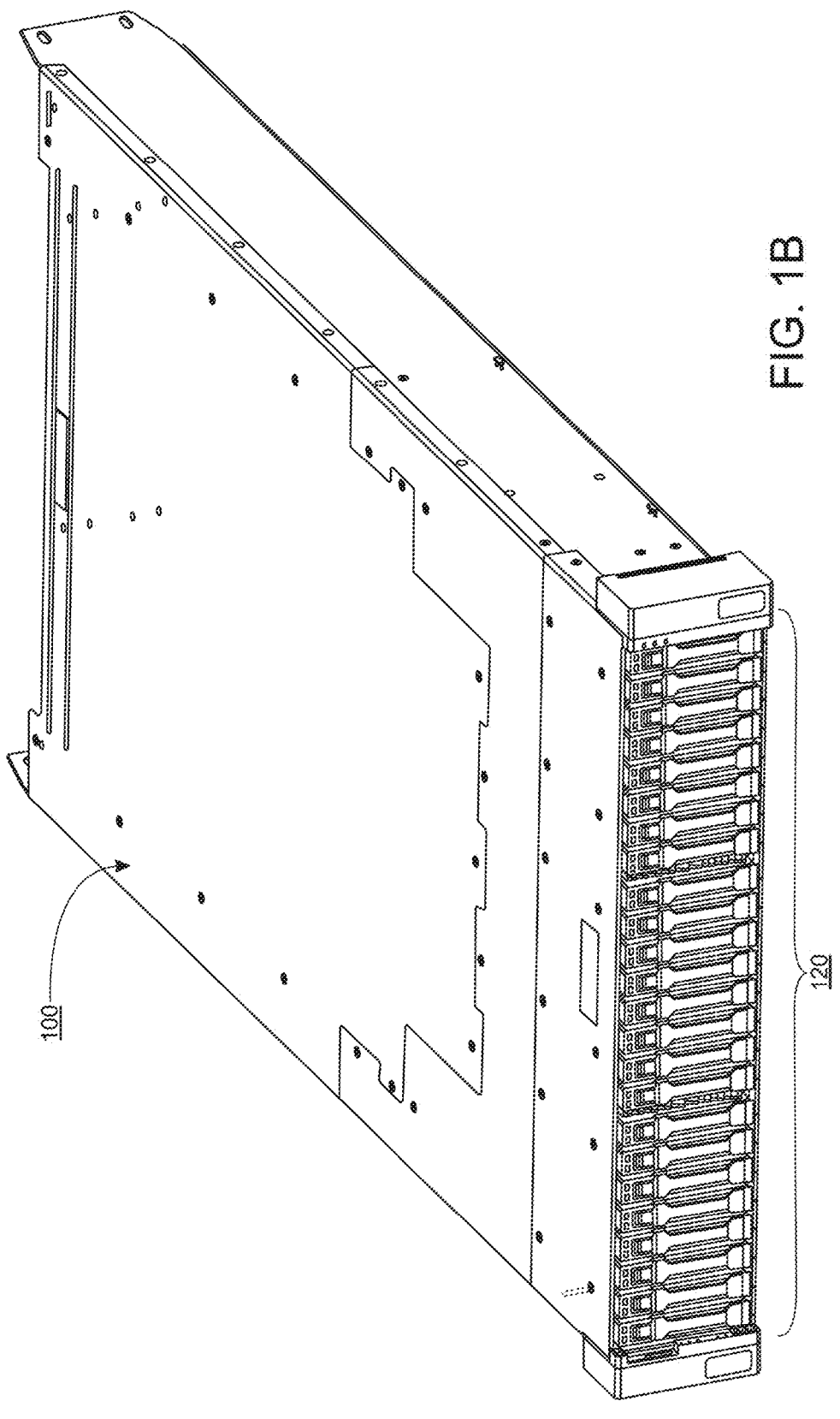
FIG. 1B illustrates the front side of the storage server chassis shown in FIG. 1A, in accordance with one aspect of the present disclosure.

FIG. 1B illustrates the front side of storage server chassis 100, in accordance with one aspect of the present disclosure. Here, the front side of chassis 100 can include a number of drive bays 120, which can accommodate a number of drives. When a node needs to be changed or upgraded, the node can be ejected and removed from the rear side of chassis 100.

Figure 2A:
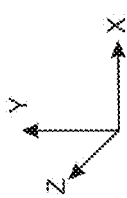
FIG. 2A illustrates a detailed view of a two-piece hybrid faceplate, in accordance with one aspect of the present disclosure.

FIG. 2A illustrates a detailed view of a two-piece hybrid faceplate, in accordance with one aspect of the present disclosure. Here, a two-piece hybrid faceplate 200 includes a frame 202 and a front face 204. Front face 204 can be made from a single sheet of metal, which can be aluminum, stainless steel, nickel, or an alloy. Note that sheet metal is metal formed by an industrial process into thin, flat pieces. Sheet metal is one of the fundamental forms used in metalworking, and it can be cut and bent into a variety of shapes. Sheet metal has a thickness that is equal to or less than 6 mm. Metal pieces thicker than 6 mm are considered plate metal as opposed to sheet metal. Frame 202 can be made from a die-cast metal, e.g., aluminum. Other metallic material, such as magnesium or alloys, can also be used. In some aspects, frame 202 has sufficient rigidity and tensile strength to withstand an injection/ejection force of at least 130 pounds for injecting or ejecting a hardware assembly.

This two-piece faceplate design allows front face 204 to be free from bearing the load associated with inserting or ejecting the hardware assembly attached to frame 202. Frame 202 can include two attachment mechanisms 221 which, when front face 204 and frame 202 are assembled, can protrude through cutout openings 226 and 228 respectively beyond the surface of front face 204, such that handles can be attached to these attachment mechanisms 221.

In some aspects, these attachment mechanisms 221 can be hinge housings 222 and 224, each of which includes an upper lip and a lower lip. After front face 204 and frame 202 are assembled, hinge housings 222 and 224 can protrude beyond front face 204. A pair of release handles 232 and 234 can be attached to hinge housings 222 and 224 via hinge pins 225, respectively. Each release handle can have a set of (e.g., two) gear teeth, such as gear teeth 236, located near the hinge pin 225. Correspondingly, the chassis can have matching gear teeth at the corresponding locations, such that when the release handles are rotated outward faceplate 200 can be moved away from the chassis.

Optionally, each release handle can have a secure screw at the end opposite to the hinge to secure the release handles after the node enclosure is inserted into the chassis. For example, release handle 232 can include a secure screw 238, which can be tightened into a threaded hole 240 located on frame 202 via an opening on front face 204. With the aforementioned configuration of release handles, when the node enclosure and its hardware assembly is inserted into or ejected from the chassis, the force for moving the node enclosure is directly applied to frame 202 via the release handles and hinge housings, while front face 204 remains free from bearing this loading force.

Various methods can be used to affix front face 204 to frame 202. In some aspects, a number of screws or rivets, such as rivets 206, can be used to secure front face 204 to frame 202. Frame 202 can include rivet holes at corresponding locations, such as rivet holes 207, to receive the rivets. Rivets 206 can be of various types. In one aspect, rivets 206 can be flush rivets, so that the rivet heads do not rise above the surface of front face 204.

To align front face 204 with frame 202, frame 202 can include raised ridges 210 and 212 along the two top edges in the Z directions, respectively. (Note that Z direction is the direction along which depth of frame 202 is measured.) To fit ridges 210 and 212, front face 204 can have two cutout gaps 214 and 216, respectively, at the matching locations along its two top edges in the Z direction. Ridges 210 and 212 can guide front face 204 during the installation process. Furthermore, the fitting between ridges 210 and 212 and cutout gaps 214 and 216 can obviate the need to close or weld the seams at the respective edges on front face 204. Welding seams of sheet metal can be costly and result in cosmetic compromises. Hence, having ridges 210 and 212 on frame 202 to fit in cutout gaps 214 and 216 on front face 204 can provide cost efficiency without sacrificing the cosmetic advantage of sheet metal.

Figure 2B:
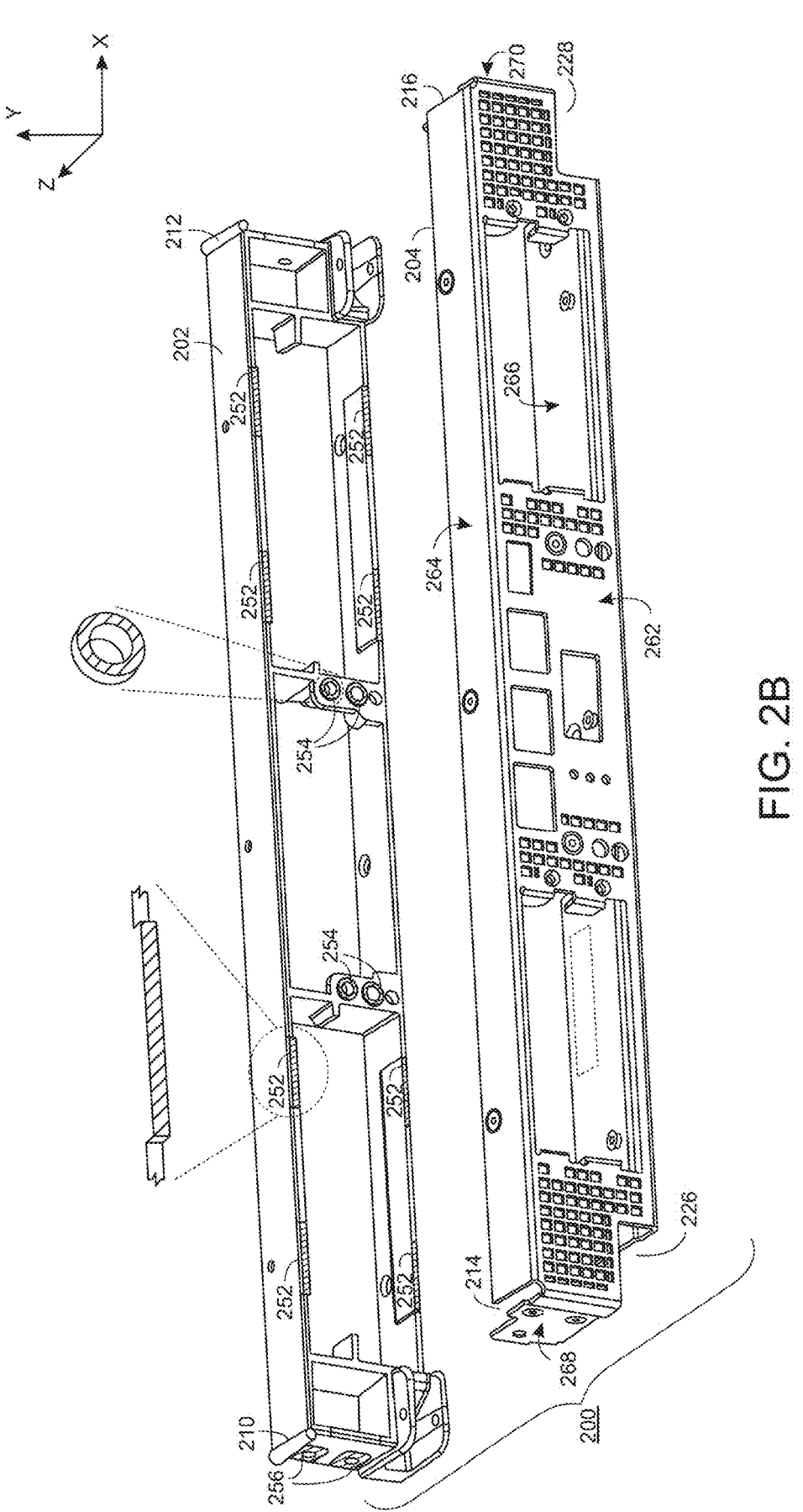
FIG. 2B illustrates the faceplate shown in FIG. 2A without the release handles, in accordance with one aspect of the present disclosure.

FIG. 2B illustrates faceplate 200 without the release handles, in accordance with one aspect of the present disclosure. In this view, cutout openings 226 and 228 are more clearly visible. In some aspects, to ensure that front face 204 can sit flush with frame 202, frame 202 can include a number of raised locations on the surface facing front face 204. These raised locations can be raised above the rest of the surface areas of frame 202 and be precision-machined (e.g., milled) to minimize deformation of the sheet metal of front face 204 when front face 204 is assembled with frame 202. In FIG. 2B, the precision-machined surfaces of these raised locations are marked with a crosshatch pattern and are in contact with the rear side with front face 204. Such raised locations can include locations 252 positioned on the upper and lower edges of frame 202. These raised locations can also include locations 254 and 256, which surround the rivet holes to provide a flat and flush contact when the corresponding rivets are installed. In some aspects, rectangular raised locations 252 can have a width of 0.3-10 mm, and a length of 3-30 mm. Raised locations 254 and 256 surrounding the rivet holes can have a radial width of 0.3-5 mm. Other dimensions are possible. In this example, frame 202 includes 10 raised locations (i.e., locations 252, 254, and 256). Other numbers of raised locations can also be placed on frame 202.

In general, sheet-metal front face 204 can be produced from a single sheet of metal. Front face 204 can include, when viewed from the front, a front side 262, a top side 264, a bottom side 266, a left side 268, and a right side 270. During manufacturing, each of the top, bottom, left, and right sides can be bent backward away from front side 262 at approximately 90 degrees. Cutout gap 214 is formed between top side 264 and left side 268. Similarly, cutout gap 216 is formed between top side 264 and right side 270. The cutout gaps can accommodate raised ridges 210 and 212 positioned on the corresponding edges of the die-cast metallic frame. In one example, the pre-folding pattern of the sheet metal can be produced using a metal-stamping process. The layout pattern on the front side of the front face can be produced using a laser cutting process.

Figure 2C:
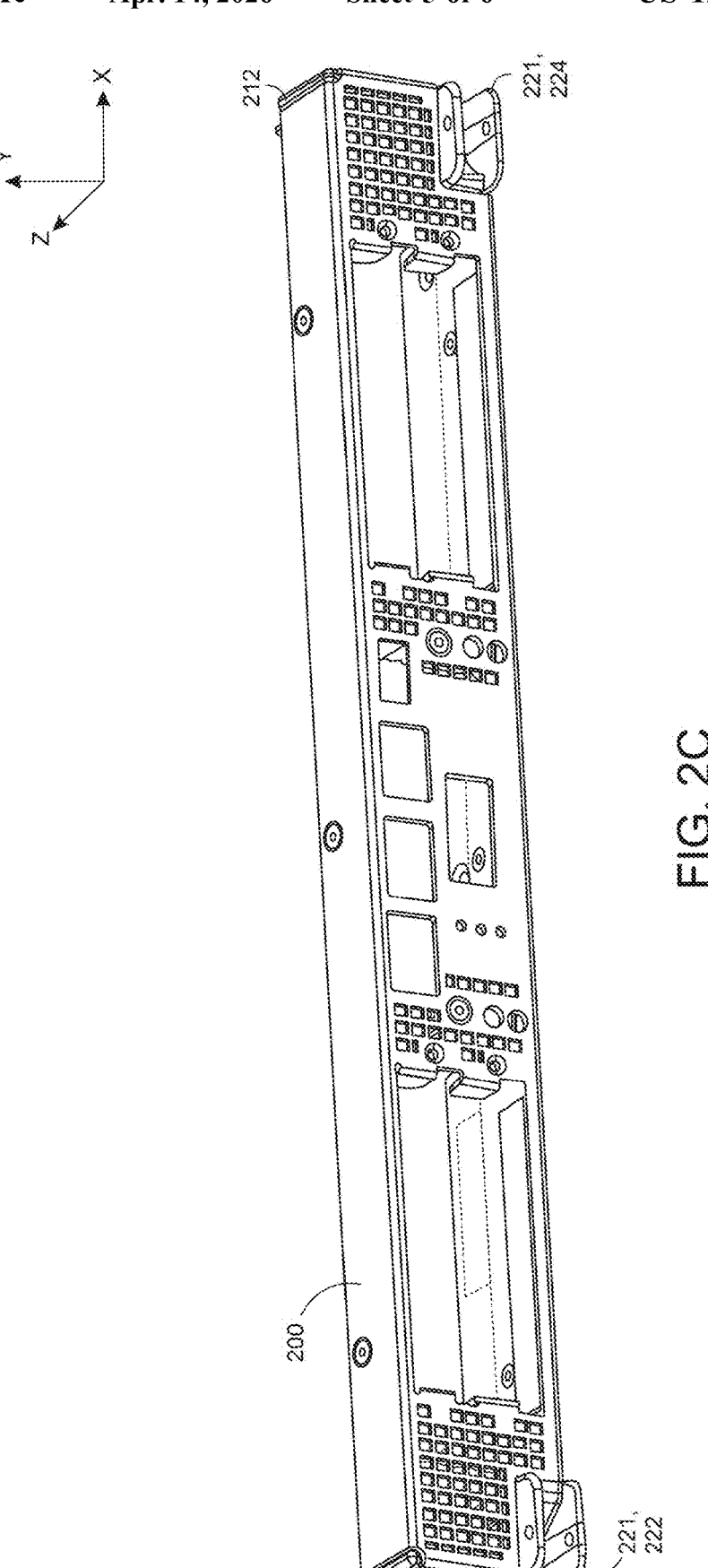
FIG. 2C illustrates the faceplate shown in FIG. 2A after the sheet-metal front face is assembled with the die-cast metallic frame, in accordance with an aspect of the present disclosure.

FIG. 2C illustrates faceplate 200 after front face 204 is assembled with frame 202, in accordance with an aspect of the present disclosure. In this view, ridges 210 and 212 on frame 202 fit into the corresponding cutout gaps on front face 204. Furthermore, hinge housings 222 and 224 fit into the corresponding cutout openings on front face 204 and protrude beyond the sheet metal for attaching the release handles.

One advantage of using sheet metal for the front face is that, compared with die-cast metal, sheet metal is easier and less costly to process in terms of changing its design and layout. For example, laser cutting can be used to create different perforations and openings on the front face. The time it takes to change the layout design of the front face is considerably shorter when compared with the time it takes to re-tool for the die casting process. In general, it may take only a few minutes to change the programing for a laser cutter to cut a new opening layout on the front face, whereas producing a new die for the die casting process can take two to four weeks. Note that it is beneficial to be able to change quickly and cost-effectively the perforation pattern, which corresponds to the open-area ratio of the faceplate, to meet the thermal requirements associated with different product designs. Various perforation patterns can have different shape, size, location, and pitch for the perforation openings.

Figures 3A, 3B, 3C:
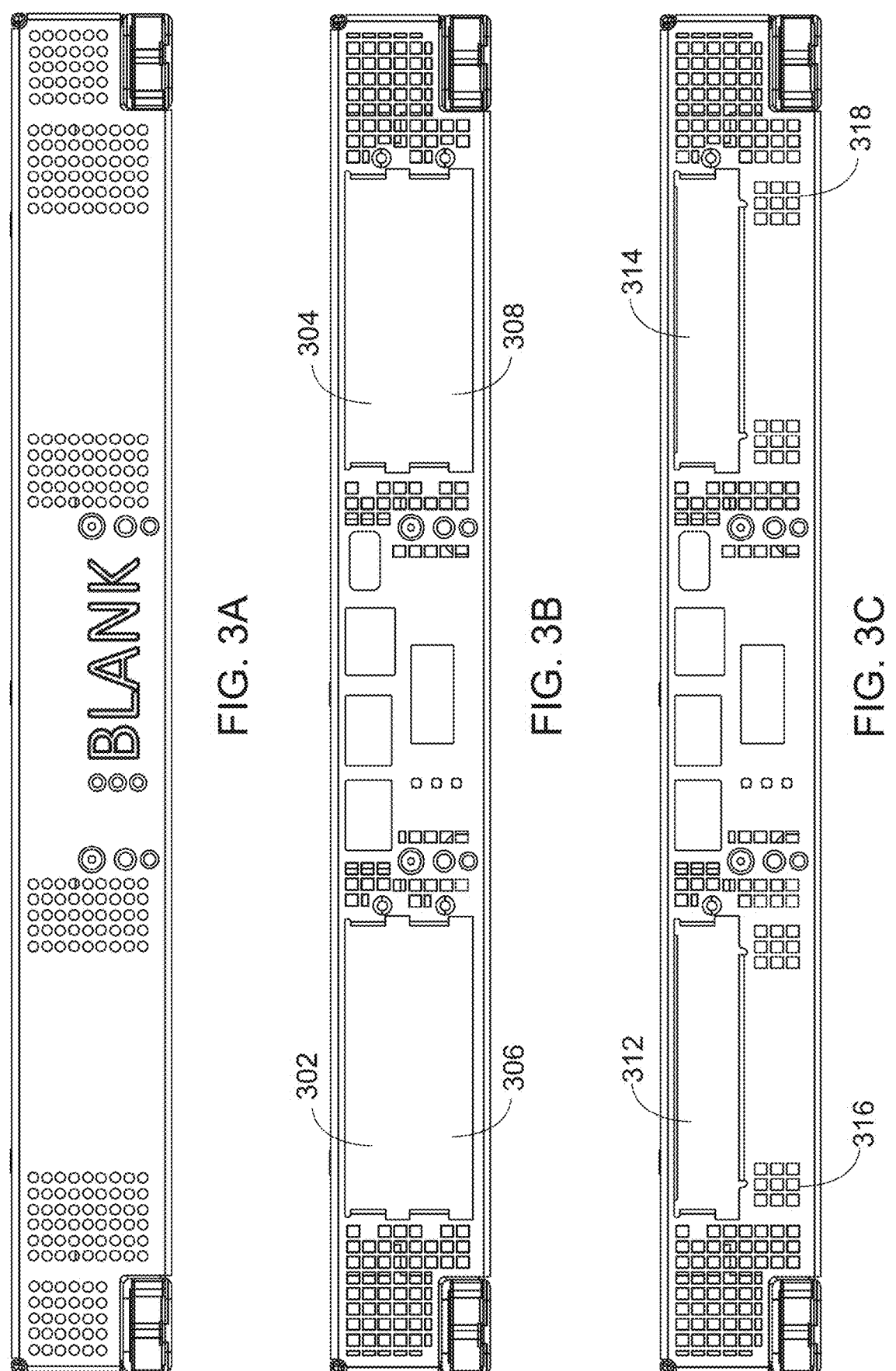
FIG. 3A illustrates a sheet-metal front face with a blank layout, in accordance with one aspect of the present disclosure.
FIG. 3B illustrates a sheet-metal front face with a first layout, in accordance with one aspect of the present disclosure.
FIG. 3C illustrates a sheet-metal front face with a second layout, in accordance with one aspect of the present disclosure.

FIG. 3A illustrates a sheet-metal front face with a blank layout, in accordance with one aspect of the present disclosure. In this example, the front face is a blank design with only perforations and the necessary screw and rivet holes.

FIG. 3B illustrates a sheet-metal front face with a first layout, in accordance with one aspect of the present disclosure. In this example, the front face includes a variety of openings, such as openings 302, 304, 306, and 308 which can accommodate host bus adapters (HBAs). Note that the front face layout in FIG. 3B also has a different perforation pattern compared with the layout in FIG. 3A.

FIG. 3C illustrates a sheet-metal front face with a second layout, in accordance with one aspect of the present disclosure. In this example, the front face has two large openings 312 and 314, and two additional sets of perforations 316 and 318, compared with the design in FIG. 3B.

Note that although the front face can have different layout designs, the die-cast metallic frame remains the same. This can significantly reduce the time-to-market when different front face layouts are needed for different products or different versions of the same product.

In summary, a two-piece hybrid faceplate design is provided. The faceplate has a die-cast metallic frame and a sheet-metal front face. The die-cast metallic frame provides the mechanical rigidity and strength for bearing the force of inserting or ejecting a hardware assembly attached to the faceplate. The sheet-metal front face is free from bearing the force of inserting or ejecting the hardware assembly. Furthermore, because the front face is made of sheet metal, the same die-cast metallic frame can be used with different front faces that have different layout designs. Hence, the use of sheet metal for the front face can save manufacturing costs and time-to-market while providing the cosmetic advantages of sheet metal compared with die-cast metal.

One aspect described in the present disclosure provides a faceplate for a computing system. The faceplate includes a die-cast metallic frame and a sheet-metal front face attached to the die cast metallic frame. The die-cast metallic frame includes at least one attachment mechanism protruding beyond the sheet-metal front face for attaching a handle used for insertion or ejection of hardware attached to the faceplate. This configuration allows the die-cast metallic frame to bear a force associated with insertion or ejection of the hardware. Furthermore, the sheet-metal front face does not bear the force associated with insertion or ejection of the hardware.

In a variation on this aspect, the attachment mechanism includes a hinge housing to accommodate a hinge pin of the handle.

In a variation on this aspect, the attachment mechanism fits within a cutout positioned at a corner of the front face.

In a variation on this aspect, the die-cast metallic frame includes at least one raised ridge along an edge in a direction along which depth of the frame is measured. In addition, the raised ridge fits with a cutout gap along a corresponding edge of the sheet-metal front face.

In a variation on this aspect, the die-cast metallic frame includes a number of contact locations to be in contact with the sheet-metal front face. The contact locations each have a flat contact surface, thereby allowing the front face to sit flush with the die-cast metallic frame.

In a further variation, at least one contact location comprises a rivet hole which allows the front face to be attached with a rivet.

In a variation on this aspect, the die-cast metallic frame can withstand a pushing or pulling force of at least 130 pounds for insertion or ejection of hardware attached to the faceplate.

In a variation on this aspect, the die-cast metallic frame comprises aluminum. The sheet-metal front face comprises aluminum or stainless steel.

In a variation on this aspect, the sheet-metal front face comprises a cutout for fitting the attachment mechanism of the die-cast metallic frame.

In a variation on this aspect, the sheet-metal front face is produced from a single sheet of metal and comprises, when viewed from the front, a front side, a top side, a bottom side, a left side, and a right side. Each of the top, bottom, left, and right sides is bent backward away from the front side at approximately 90 degrees. In addition, the sheet-metal front face includes two cutout gaps between the left side and top side and between the right side and the top side, respectively. These cutout gaps can accommodate raised ridges positioned on the corresponding edges of the die-cast metallic frame.

Another aspect of the present disclosure provides a faceplate for a computing system. The faceplate includes a die-cast metallic frame which includes two attachment mechanisms positioned on two lower front-facing corners, respectively, and two raised ridges along two top edges in a direction in which depth is measured.

The faceplate can further include a sheet-metal front face mechanically coupled to the die-cast metallic frame. The front face includes a single sheet of metal and includes two cutouts positioned, respectively, on two lower corners of the front face to fit the attachment mechanisms which protrude beyond the front face. The front face further includes two cutout gaps between a left side and a top side and between a right side and the top side of the front face, respectively, to accommodate the raised ridges of the die-cast metallic frame.

In addition, the attachment mechanisms can be coupled to a pair of handles and can withstand a pushing or pulling force of at least 130 pounds for insertion or ejection of hardware attached to the faceplate. In turn, the sheet-metal front face front does not bear the force associated with insertion or ejection of the hardware.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A faceplate for a computing system, the faceplate comprising:
   a die-cast metallic frame comprising a front face having a length; and
   a sheet-metal front face extending along the length, wherein a rear side of the sheet-metal front face is attached to the die-cast metallic frame such that the sheet-metal front face covers the front face of the die-cast metallic frame;
   wherein the die-cast metallic frame comprises at least one attachment mechanism protruding beyond the sheet-metal front face for attaching a handle used for insertion or ejection of hardware attached to the faceplate, thereby allowing the die-cast metallic frame to bear a force associated with insertion or ejection of the hardware;
   wherein the sheet-metal front face does not bear the force associated with insertion or ejection of the hardware; and
   wherein, in a state of the faceplate coupled to a node enclosure of the computing system, the faceplate forms a front face of the node enclosure with each of the die-cast metallic frame of the faceplate and the sheet-metal front face of the faceplate extending together across a width of the node enclosure.

2. The faceplate of claim 1,
   wherein the attachment mechanism comprises a hinge housing to accommodate a hinge pin of the handle.

3. The faceplate of claim 1,
   wherein the attachment mechanism fits within a cutout positioned at a corner of the sheet-metal front face.

4. The faceplate of claim 1,
   wherein the die-cast metallic frame comprises at least one raised ridge along an edge in a direction along which depth of the frame is measured; and
   wherein the raised ridge fits within a cutout gap along a corresponding edge of the sheet-metal front face.

5. The faceplate of claim 1,
   wherein the die-cast metallic frame comprises a number of contact locations to be in contact with the sheet-metal front face; and
   wherein the contact locations each have a flat contact surface, thereby allowing the sheet-metal front face to sit flush with the die-cast metallic frame.

6. The faceplate of claim 5,
   wherein at least one contact location comprises a hole which allows the sheet-metal front face to be attached with a rivet.

7. The faceplate of claim 1,
   wherein the die-cast metallic frame can withstand at least 130 pounds of pushing or pulling force for insertion or ejection of hardware attached to the faceplate.

8. The faceplate of claim 1,
   wherein the die-cast metallic frame comprises aluminum; and
   wherein the sheet-metal front face comprises aluminum, steel, or stainless steel.

9. The faceplate of claim 1,
   wherein the sheet-metal front face is produced from a single sheet of metal;
   wherein each of a top side, a bottom side, a left side, and a right side of the sheet-metal front face is bent backward away from a front side of the sheet-metal front face at approximately 90 degrees when viewed from the front; and
   wherein the sheet-metal front face comprises two cutout gaps between the left side and top side and between the right side and the top side, respectively, the cutout gaps to accommodate raised ridges positioned on the corresponding edges of the die-cast metallic frame.

10. The faceplate of claim 1,
   wherein the node enclosure comprises a base pan, and wherein the faceplate is configured to be coupled the node enclosure at the base pan to form the front face of the node enclosure.

11. A faceplate for a computing system, the faceplate comprising:

a die-cast metallic frame, comprising:

a front face having a length;

two attachment mechanisms positioned on two lower front-facing corners, respectively; and two raised ridges along two top edges in a direction in which depth is measured; and a sheet-metal front face extending along the length, wherein a rear side of the sheet-metal front face is mechanically coupled to the die-cast metallic frame such that the sheet-metal front face covers the front face of the die-cast metallic frame, the sheet-metal front face comprising a single sheet of metal and further comprising:

two cutout openings positioned, respectively, on two lower corners of the sheet-metal front face to fit the attachment mechanisms which protrude beyond the sheet-metal front face; and two cutout gaps between a left side and a top side and between a right side and the top side of the sheet-metal front face, respectively, to accommodate the raised ridges of the die-cast metallic frame;

wherein the attachment mechanisms are coupled to a pair of handles and can withstand a pushing or pulling force for insertion or ejection of hardware attached to the faceplate;

wherein the sheet-metal front face front does not bear the force associated with insertion or ejection of the hardware; and wherein, in a state of the faceplate coupled to a node enclosure of the computing system, the faceplate forms a front face of the node enclosure with each of the die-cast metallic frame of the faceplate and the sheet-metal front face of the faceplate extending together across a width of the node enclosure.

12. A computing system, comprising:

a chassis; and one or more node enclosures housed in the chassis, wherein a respective node enclosure encloses a computing node and comprises a faceplate comprising:

a die-cast metallic frame comprising a front face having a length; and a sheet-metal front face extending along the length, wherein a rear side of the sheet-metal front face is attached to the die-cast metallic frame such that the sheet-metal front face covers the front face of the die-cast metallic frame;

wherein the die-cast metallic frame comprises at least one attachment mechanism protruding beyond the sheet-metal front face for attaching a handle used for insertion or ejection of hardware attached to the faceplate, thereby allowing the die-cast metallic frame to bear a force associated with insertion or ejection of the hardware;

wherein the sheet-metal front face does not bear the force associated with insertion or ejection of the hardware; and wherein, in a state of the faceplate coupled to the respective node enclosure, the faceplate forms a front face of the respective node enclosure with each of the die-cast metallic frame of the faceplate and the sheet-metal front face of the faceplate extending together across a width of the respective node enclosure.

13. The computing system of claim 12, wherein the attachment mechanism comprises a hinge housing to accommodate a hinge pin of the handle.

14. The computing system of claim 12, wherein the attachment mechanism fits within a cutout positioned at a corner of the sheet-metal front face.

15. The computing system of claim 12, wherein the die-cast metallic frame comprises at least one raised ridge along an edge in a direction along which depth of the frame is measured; and wherein the raised ridge fits with a cutout gap along a corresponding edge of the sheet-metal front face.

16. The computing system of claim 12, wherein the die-cast metallic frame comprises a number of contact locations to be in contact with the sheet-metal front face; and wherein the contact locations each have a flat contact surface, thereby allowing the sheet-metal front face to sit flush with the die-cast metallic frame.

17. The computing system of claim 16, wherein at least one contact location comprises a hole which allows the sheet-metal front face to be attached with a rivet.

18. The computing system of claim 12, wherein the die-cast metallic frame can withstand at least 130 pounds of pushing or pulling force for insertion or ejection of hardware attached to the faceplate.

19. The computing system of claim 12, wherein the die-cast metallic frame comprises aluminum; and wherein the sheet-metal front face comprises aluminum, steel, or stainless steel.

20. The computing system of claim 12, wherein the sheet-metal front face is produced from a single sheet of metal; wherein each of a top side, a bottom side, a left side, and a right side of the sheet-metal front face is bent backward away from a front side of the sheet-metal front face at approximately 90 degrees when viewed from the front; and wherein the sheet-metal front face comprises two cutout gaps between the left side and top side and between the right side and the top side, respectively, the cutout gaps to accommodate raised ridges positioned on the corresponding edges of the die-cast metallic frame.

* * * * *